(12) United States Patent
Lin et al.

(10) Patent No.: US 10,617,023 B2
(45) Date of Patent: Apr. 7, 2020

(54) WEARABLE ELECTRONIC DEVICE

(71) Applicants: INVENTEC (PUDONG) TECHNOLOGY CORPORATION, Shanghai (CN); INVENTEC CORPORATION, Taipei (TW)

(72) Inventors: Chun-Chi Lin, Taipei (TW); Ying-Shan Chen, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/172,092

(22) Filed: Oct. 26, 2018

(65) Prior Publication Data
US 2019/0373747 A1 Dec. 5, 2019

(30) Foreign Application Priority Data

Jun. 1, 2018 (CN) .......................... 2018 1 0558654

(51) Int. Cl.
| | |
|---|---|
| H05K 5/00 | (2006.01) |
| H02J 50/10 | (2016.01) |
| A44C 23/00 | (2006.01) |
| H01Q 1/27 | (2006.01) |
| H02J 7/00 | (2006.01) |
| H02J 7/02 | (2016.01) |
| H05K 7/14 | (2006.01) |

(52) U.S. Cl.
CPC ........... *H05K 5/0086* (2013.01); *A44C 23/00* (2013.01); *H01Q 1/273* (2013.01); *H02J 7/0047* (2013.01); *H02J 7/025* (2013.01); *H02J 50/10* (2016.02); *H05K 7/1427* (2013.01)

(58) Field of Classification Search
CPC .... H05K 5/0086; H05K 7/1427; H01Q 1/273; H02J 7/025; H02J 50/10; H02J 7/0047; A44C 23/00; A44C 5/209; A44C 5/2095; A44C 5/18; A44C 5/185; A44C 5/004; A44C 5/005; A44C 5/142; A44C 5/20; G06F 1/163
USPC ................................ 361/679.03, 728; 63/13
See application file for complete search history.

(56) References Cited

U.S. PATENT DOCUMENTS

| | | | | |
|---|---|---|---|---|
| 6,122,933 | A * | 9/2000 | Ohlund ............... | A44C 15/0015 362/104 |
| 6,289,559 | B1 * | 9/2001 | Langer ................... | A44C 5/185 24/116 A |
| 6,484,376 | B1 * | 11/2002 | Khatchadourian .. | A44C 5/2052 24/116 A |
| 7,001,056 | B2 * | 2/2006 | Clegg ................. | A44C 15/0015 362/104 |
| 9,932,133 | B2 * | 4/2018 | Sherman ............... | A44C 11/002 |
| 2002/0089859 | A1 * | 7/2002 | Jackson ............. | A44C 15/0015 362/571 |

(Continued)

*Primary Examiner* — Daniel S Wickland
*Assistant Examiner* — Sagar Shrestha
(74) *Attorney, Agent, or Firm* — Maschoff Brennan (57) ABSTRACT

A wearable electronic device includes a primary bead, two spacer beads and a bead string. The two spacer beads each defines a first side and a second side opposite to each other. The first sides of the two spacer beads are respectively disposed on two opposite sides of the primary bead. Two ends of the bead string are respectively connected to the second sides of the two spacer beads.

18 Claims, 12 Drawing Sheets

(56) References Cited

U.S. PATENT DOCUMENTS

| | | | |
|---|---|---|---|
| 2005/0185400 A1* | 8/2005 | Hsu | A47G 33/0836 |
| | | | 362/238 |
| 2009/0044566 A1* | 2/2009 | Underdown | A44C 15/0015 |
| | | | 63/3 |
| 2016/0095395 A1* | 4/2016 | McRae | H04B 10/1143 |
| | | | 340/531 |
| 2016/0254587 A1* | 9/2016 | Jung | H01Q 1/273 |
| | | | 343/702 |
| 2018/0090975 A1* | 3/2018 | Lee | H01Q 1/273 |

* cited by examiner

WEARABLE ELECTRONIC DEVICE

CROSS-REFERENCE TO RELATED APPLICATIONS

This non-provisional application claims priority under 35 U.S.C. § 119(a) on Patent Application No(s). 201810558654.4 filed in China on Jun. 1, 2018, the entire contents of which are hereby incorporated by reference.

TECHNICAL FIELD

The present disclosure provides a wearable electronic device, more particularly, a wearable electronic device in a compact size.

BACKGROUND

With the rapid development of technology, some wearable accessories, such as prayer beads, have been electronicized to become wearable electronic devices having functions such as automatic counting, time displaying and wireless communicating. Generally, a string of prayer beads includes a string and multiple beads strung on the string, and the string of the prayer beads is usually annular. The electronic components are disposed in a primary bead to enable the connection and interaction of the electronic components. Due to the desire for compactness of electronic devices in recent years, the size of the wearable electronic device has been reduced to satisfy this desire for a compact size.

SUMMARY

According to one aspect of the disclosure, a wearable electronic device includes a primary bead, two spacer beads and a bead string. The two spacer beads each defines a first side and a second side opposite to each other. The first sides of the two spacer beads are respectively disposed on two opposite sides of the primary bead. Two ends of the bead string are respectively connected to the second sides of the two spacer beads.

BRIEF DESCRIPTION OF THE DRAWINGS

The present disclosure will become more understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
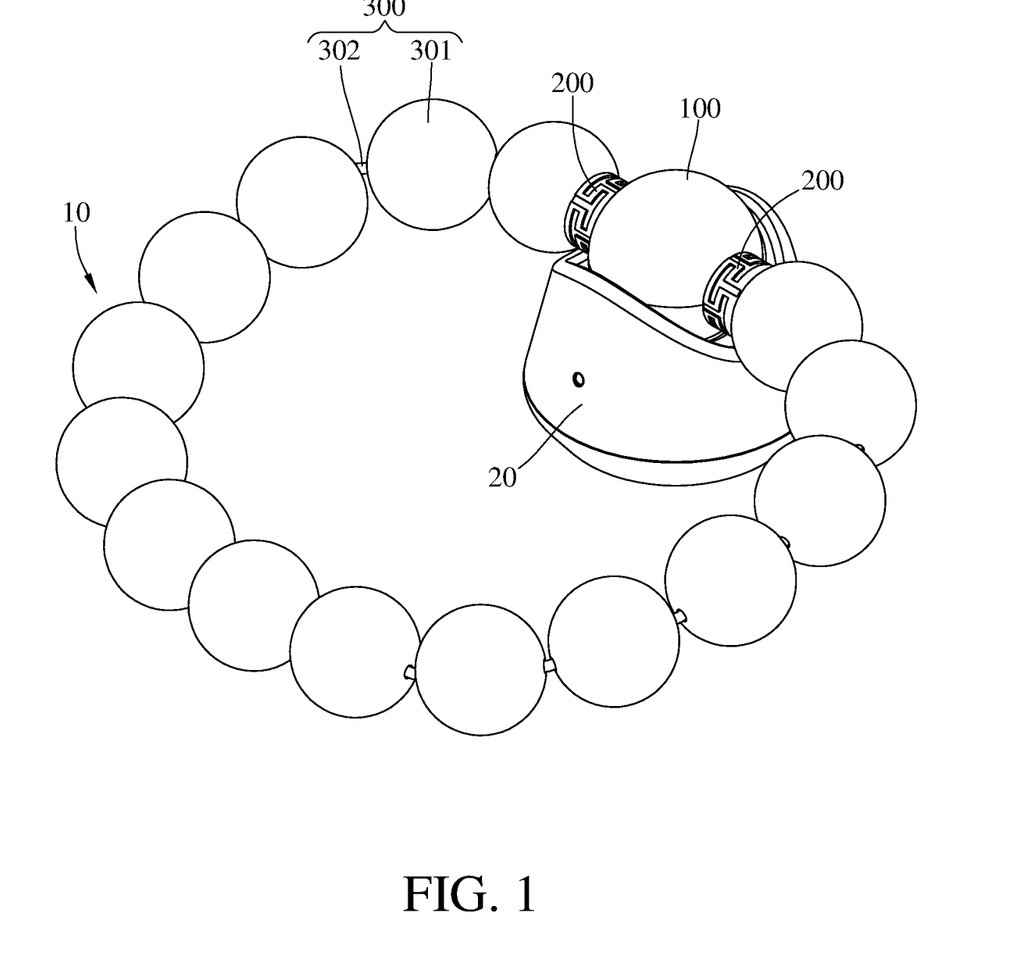
FIG. 1 is a perspective view of a wearable electronic device, positioned on a charger, according to a first embodiment.
Figure 2:
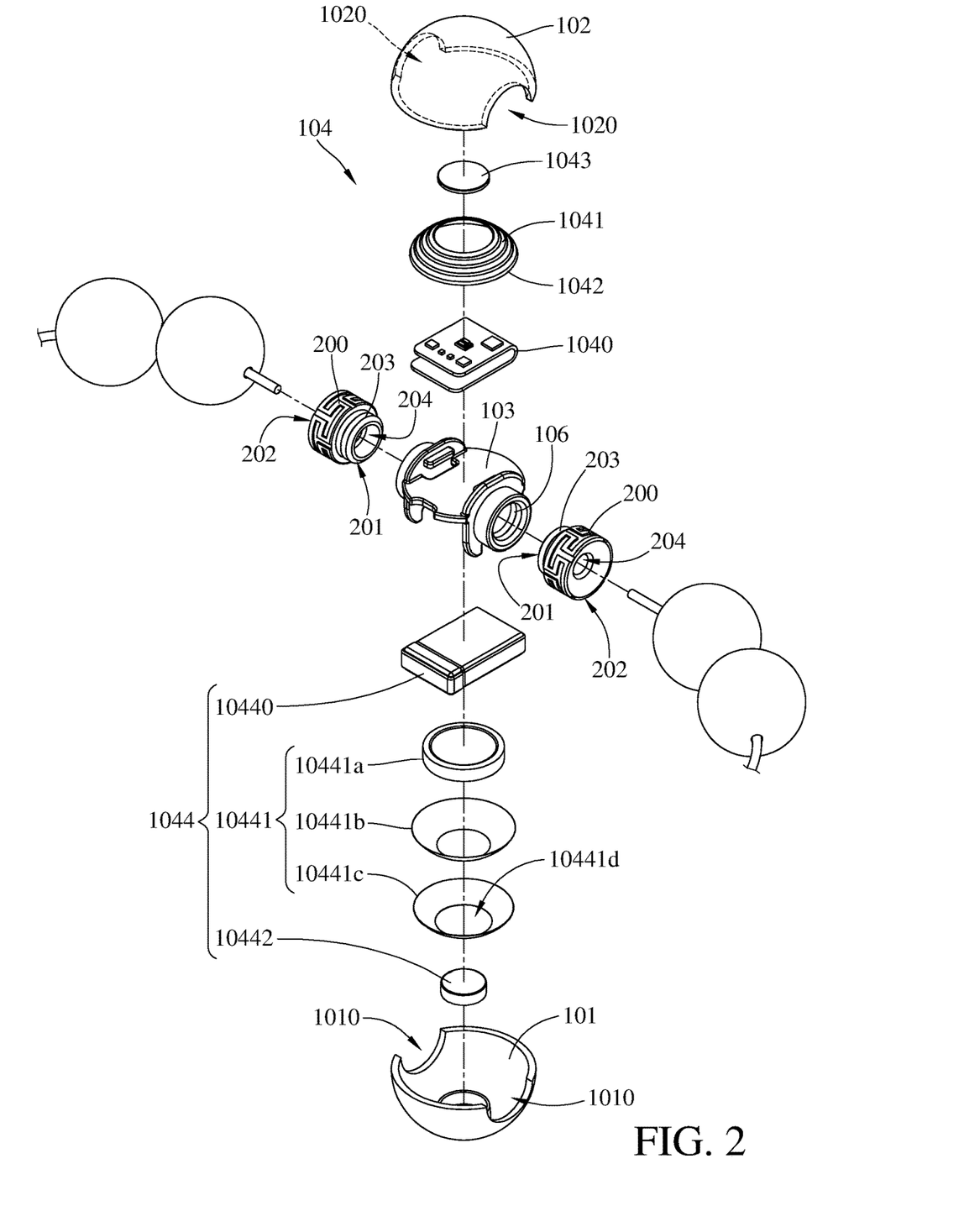
FIG. 2 is an exploded view of the wearable electronic device in FIG. 1.
Figure 3:
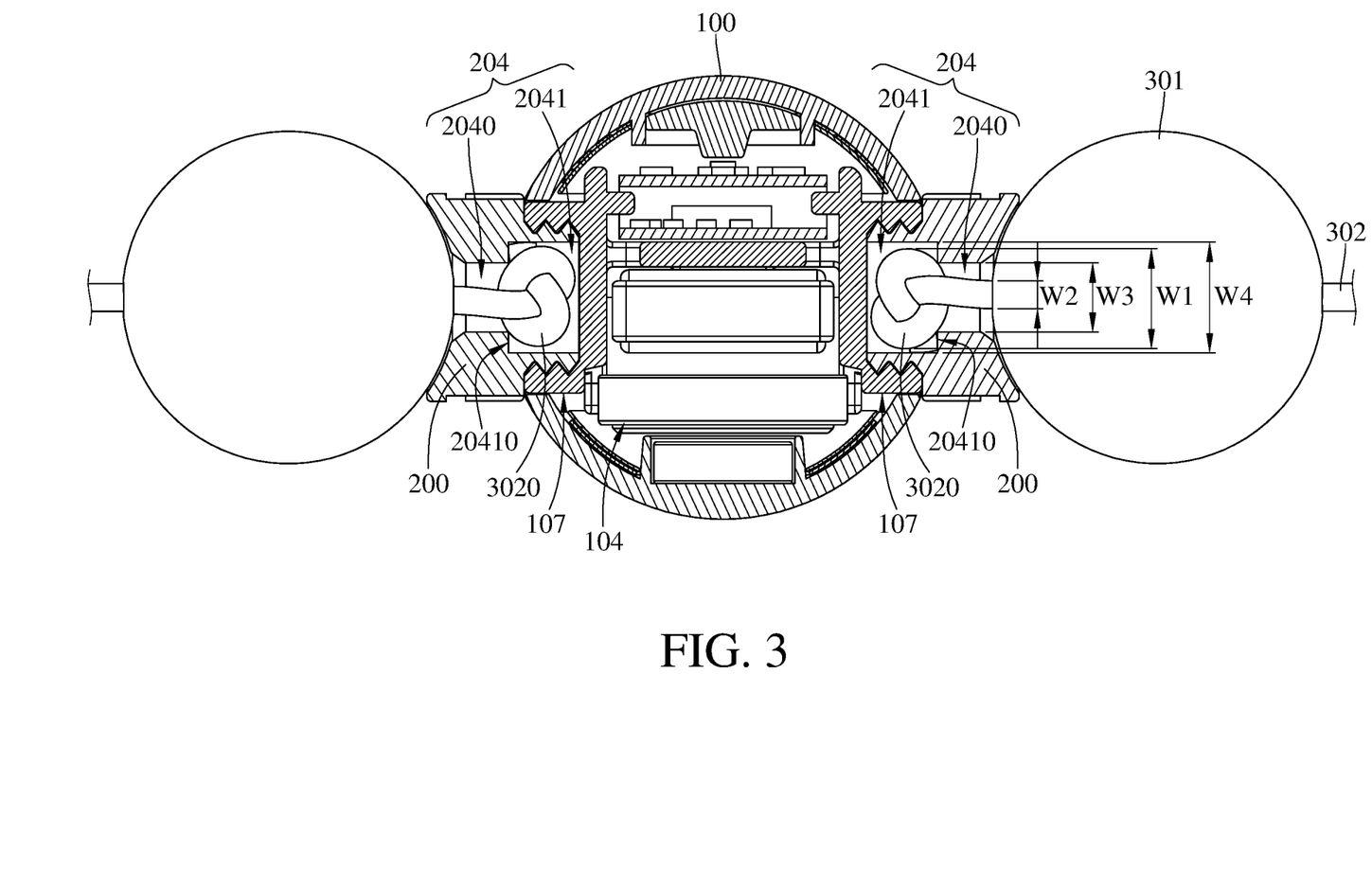
FIG. 3 is a cross-sectional view of the wearable electronic device in FIG. 1.

Please refer to FIG. 1 through FIG. 3. FIG. 1 is a perspective view of a wearable electronic device, positioned on a charger, according to a first embodiment. FIG. 2 is an exploded view of the wearable electronic device in FIG. 1. FIG. 3 is a cross-sectional view of the wearable electronic device in FIG. 1.

In this embodiment, a wearable electronic device 10 is adapted to be positioned on a charger 20 for wireless charging. The wearable electronic device 10 includes a primary bead 100, two spacer beads 200 and a bead string 300. The primary bead 100 includes a first casing 101, a second casing 102 and a base 103. The first casing 101 is, for example, a hemispherical casing configured to be positioned on the charger 20. The second casing 102 is, for example, another hemispherical casing assembled with the first casing 101. The first casing 101 is assembled with the second casing 102 so as to jointly form a spherical shell. The first casing 101 has two first recesses 1010 which are respectively located on two opposite sides of the first casing 101. The second casing 102 has two second recesses 1020 which are respectively located on two opposite sides of the second casing 102. When the first casing 101 is assembled with the second casing 102, the first recess 1010 and the second recess 1020, located on the left side of the primary bead 100, jointly define an accommodation groove 107; similarly, the first recess 1010 and the second recess 1020, located on right side of the primary bead 100, jointly define another accommodation groove 107.

The base 103 is surrounded by the first casing 101 and the second casing 102 so as to be positioned in the spherical shell, and the base 103 is leaned against the first casing 101 and the second casing 102. In this embodiment, the base 103 includes a platform structure, and the platform structure is plate-shaped. The base 103 of the primary bead 100 further includes two screw holes 106 respectively located on two opposite sides of the base 103, and the two screw holes 106 are respectively accommodated in the two accommodation grooves 107. The base 103 includes a platform structure in this embodiment, but the present disclosure is not limited thereto. In some other embodiments, the base includes a U-shaped structure. A detailed description of the recessed structure is referred in another embodiment and is disclosed in other paragraphs.

Each of the two spacer beads 200 defines a first side 201 and a second side 202. The two first sides 201 of the two spacer beads 200 are detachably disposed on two opposite sides of the primary bead 100, respectively. Specifically, each spacer bead 200 includes a thread structure 203 located on the first side 201. The two thread structures 203 of the two spacer beads 200 are screwed into the two screw holes 106 of the base 103 of the primary bead 100, respectively.

The primary bead 100 further includes an electronic assembly 104 installed on the base 103. In detail, the electronic assembly 104 includes a circuit board 1040, a three dimensional (3D) antenna 1041, a shielding sheet 1042, a lens 1043 and a power supply 1044. The circuit board 1040 is disposed on a side of the base 103 close to the second casing 102. The 3D antenna 1041 is disposed on a side of the circuit board 1040 away from the base 103, and the 3D antenna 1041 is electrically connected to the circuit board 1040. Moreover, the 3D antenna 1041 is circular, and thus the circular 3D antenna 1041 is more fitted to the hemispherical second casing 102 than a planar antenna, making the space in the primary bead 100 properly utilized. The shielding sheet 1042 is attached to the 3D antenna 1041 for preventing poor antenna efficiency due to electromagnetic interference. The lens 1043 is disposed between the 3D antenna 1041 and the second casing 102. The lens 1043 is configured to receive light emitted from a light source (not shown in the drawings) located above the circuit board 1040 so as to achieve uniform illumination of the primary bead 100.

The power supply 1044 includes a battery 10440, a wireless charging member 10441 and a magnet 10442. The battery 10440 is disposed on a side of the base 103 close to the first casing 101, and the battery 10440 is electrically connected to the circuit board 1040. The wireless charging member 10441 is disposed on a side of the battery 10440 away from the base 103, and the wireless charging member 10441 is electrically connected to the battery 10440. In detail, the wireless charging member 10441 includes a microvibrator 10441a, a charging coil 10441b, and a shielding sheet 10441c. The microvibrator 10441a is disposed on a side of the battery 10440 away from the base 103. When the battery 10440 is out of energy, the microvibrator 10441a vibrates to remind a user. The charging coil 10441b, configured to provide power to the battery 10440, covers the microvibrator 10441a and is electrically connected to the battery 10440. The shielding sheet 10441c is attached to the charging coil 10441b for preventing unfavorable influence on the power supply 1044 due to electromagnetic interference. The charging coil 10441b defines an accommodation space 10441d, and the magnet 10442 is accommodated in the accommodation space 10441d. Since the charging coil 10441b surrounds the magnet 10442, the accommodation space 10441d of the charging coil 10441b is properly utilized.

The magnet 10442 is configured to interact with magnets in the charger 20, and the user is able to adjust the relative positions between the wearable electronic device 10 and the charger 20. The adjusted position of the wearable electronic device 10 is favorable for enhancing charging efficiency.

The bead string 300 is connected to the second sides 202 of the two spacer beads 200. In this embodiment, the bead string 300 includes multiple subsidiary beads 301 and a stringing member 302. The stringing member 302 is, for example, an elastic rope. The subsidiary beads 301 and the spacer beads 200 are strung on the stringing member 302. The subsidiary beads 301 are located between the two spacer beads 200; that is, the two spacer beads 200 are respectively adjacent to two opposite ends of the stringing member 302, and the subsidiary beads 301 are located on a middle section of the stringing member 302. The stringing member 302 includes two knots 3020 respectively located on two opposite ends of the stringing member 302. Two opposite ends of the stringing member 302 are tied to form the two knots 3020, and the width W1 of the knot 3020 is larger than the width W2 of the stringing member 302. Each spacer bead 200 has a through hole 204, and a first section 2040 of the through hole 204 is connected to a second section 2041 of the through hole 204. The first section 2040 is closer to the subsidiary beads 301 than the second section 2041, and the width W4 of the second section 2041 is larger than the width W3 of the first section 2040; that is, there is a step between the first section 2040 and the second section 2041, and a bearing surface 20410 of the through hole 204 is formed between the first section 2040 and the second section 2041. Since the width W2 of the stringing member 302 is smaller than the width W3 of the first section 2040 and the width W1 of the knot 3020 is between the widths W3 and W4, the two knots 3020 are respectively leaned against the two bearing surfaces 20410 of the two spacer beads 200, such that the stringing member 302 is fastened with the two spacer beads 200. In this embodiment, the stringing member 302 is fastened with the spacer bead 200 by leaning the knot 3020 against the bearing surface 20410, but the present disclosure is not limited thereto. In some other embodiments, two blocking members are respectively disposed on two ends of the stringing member, and the blocking member is hooked to the spacer bead.

When the user wants to change the number of the subsidiary bead 301 or replace the subsidiary bead 301, the spacer bead 200 is rotated manually to separate the thread structure 203 of the spacer bead 200 from the screw hole 106 of the primary bead 100. After the spacer bead 200 is separated from the primary bead 100, the knot 3020 of the stringing member 302 is exposed to the outside, and then the user is able to untie the knot 3020 to remove the spacer bead 200 strung on the stringing member 302 for changing the number of the subsidiary bead 301 or replacing the subsidiary bead 301 with another subsidiary bead having a different appearance. After the aforementioned change is accomplished, the end of the stringing member 302 is tied again to form the knot 3020. The spacer bead 200 is rotated manually again to screw the thread structure 203 into the screw hole 106, and the knot 3020 is leaned against the bearing surface 20410 to make the stringing member 302 fixed in the spacer bead 200. Therefore, it is favorable for the user easily changing the subsidiary bead 301 according to personal preference.

Figure 4:
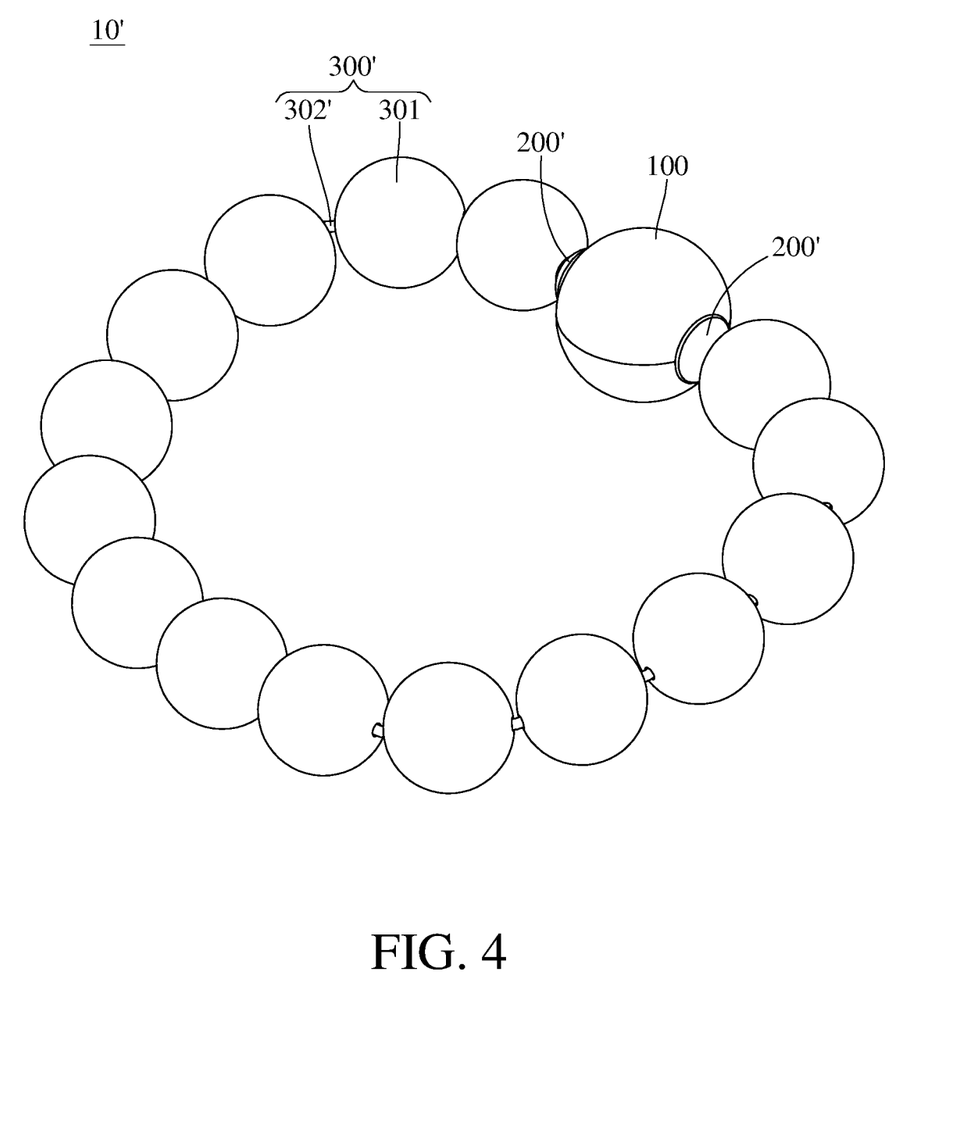
FIG. 4 is a perspective view of a wearable electronic device according to a second embodiment.
Figure 5:
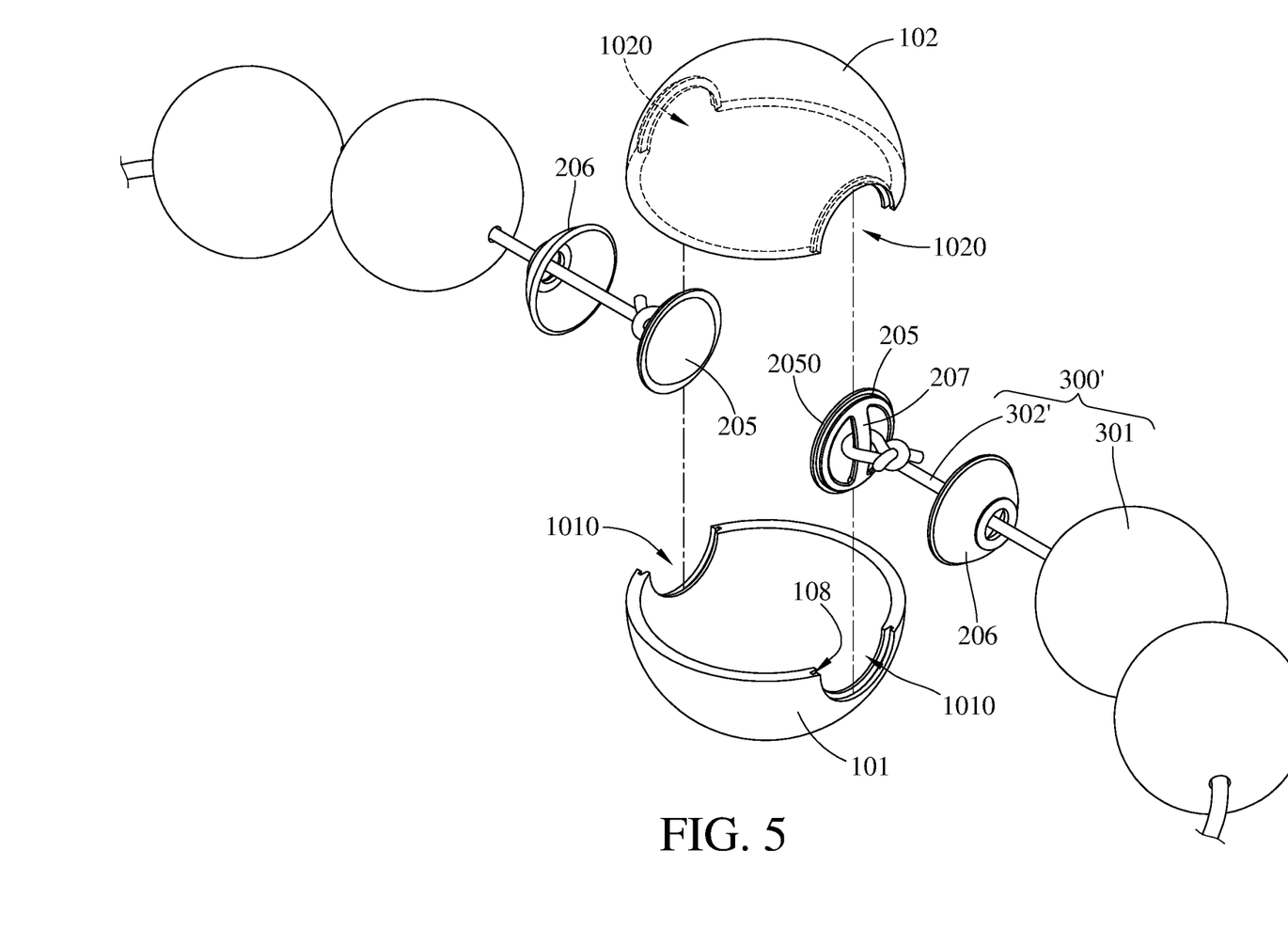
FIG. 5 is an exploded view of the first casing, the second casing, spacer beads and the bead string in FIG. 4.
Figure 6:
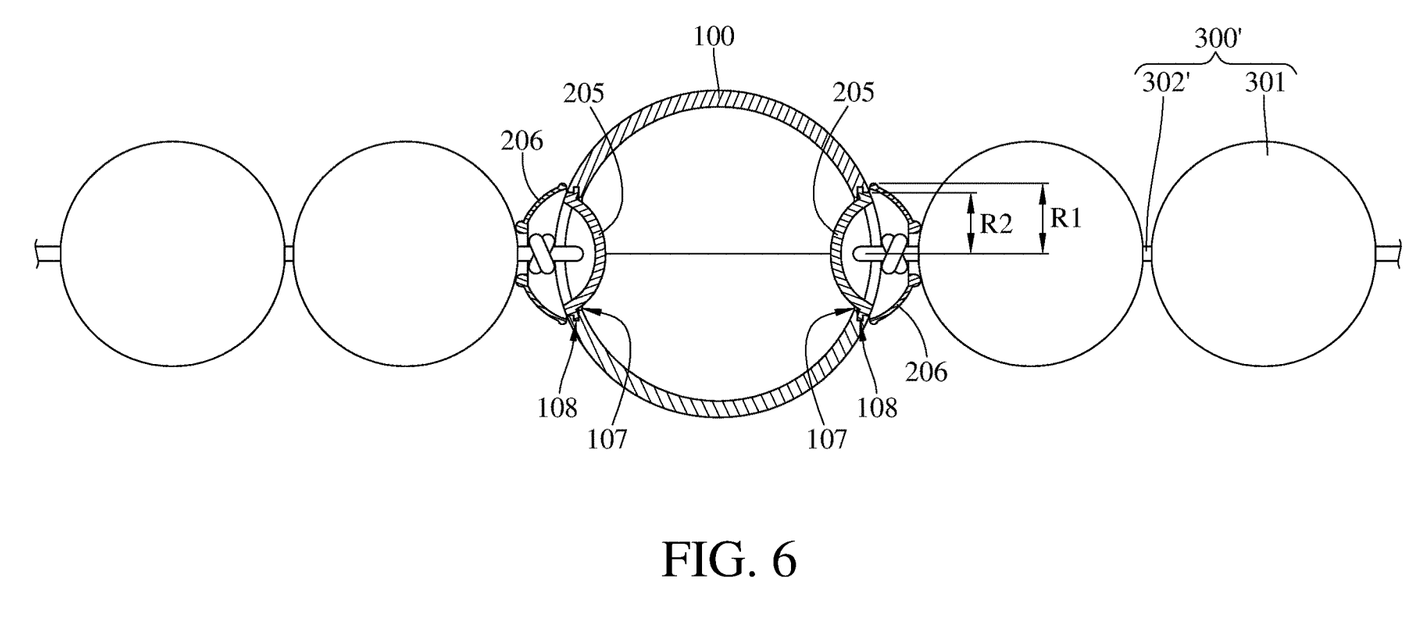
FIG. 6 is a cross-sectional view of the wearable electronic device in FIG. 4.
Figure 7:
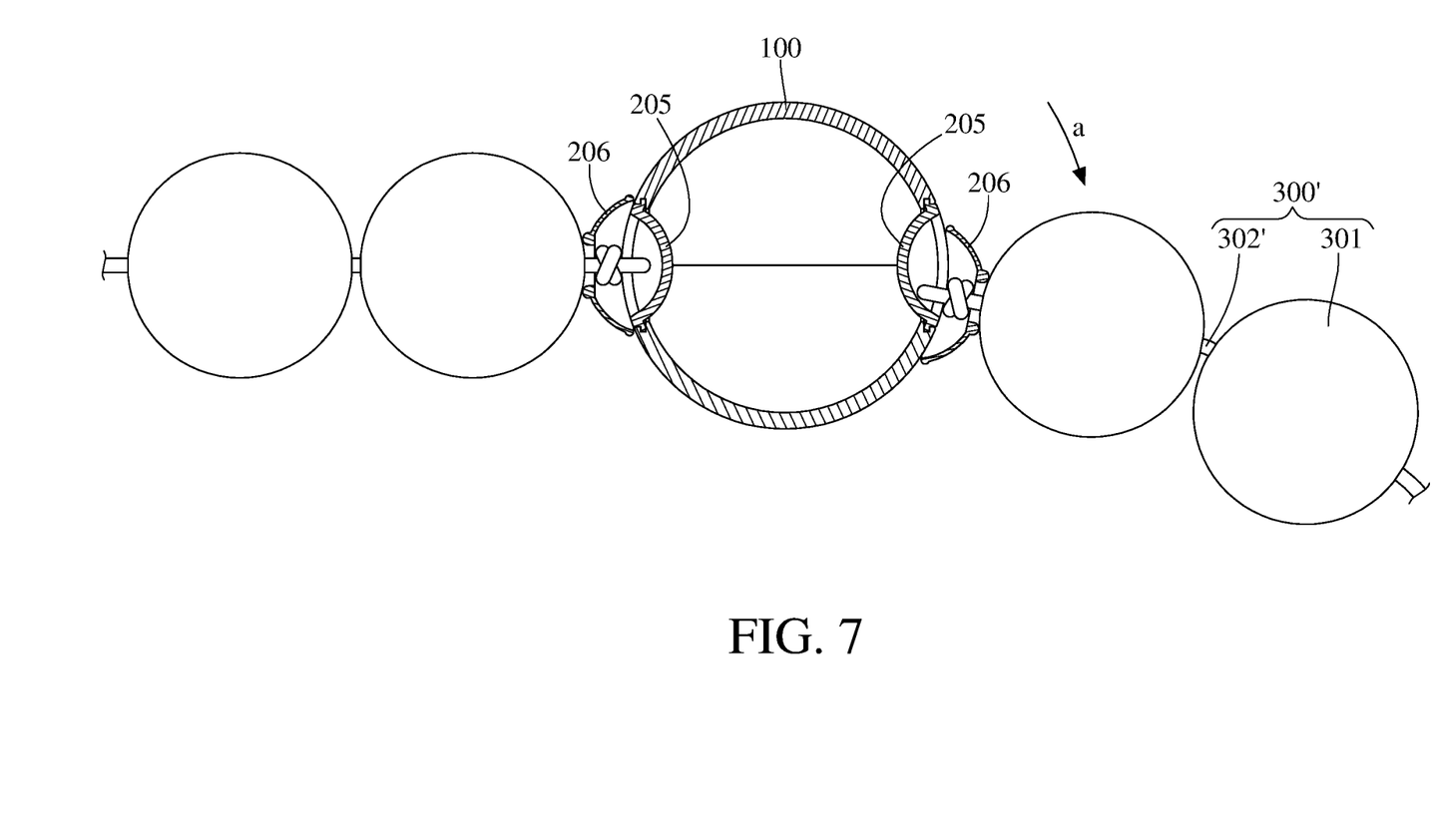
FIG. 7 is a cross-sectional view of the wearable electronic device in FIG. 6, with a moved cover.

In the first embodiment, the thread structure 203 of the spacer bead 200 is screwed into the screw hole 106 of the primary bead 100, but the disclosure is not limited thereto. Please refer to FIG. 4 through FIG. 7. FIG. 4 is a perspective view of a wearable electronic device according to a second embodiment. FIG. 5 is an exploded view of the first casing, the second casing, spacer beads and bead string in FIG. 4. FIG. 6 is a cross-sectional view of the wearable electronic device in FIG. 4. FIG. 7 is a cross-sectional view of the wearable electronic device in FIG. 6, with a moved cover.

In this embodiment, each spacer bead 200' includes a connecting member 205, a cover 206 and a fixing ring 207. The connecting member 205 is connected to the cover 206, and the connecting member 205 is detachably disposed on the primary bead 100. In detail, the primary bead 100 includes two accommodation grooves 107 and two slots 108. A first casing 101 of the primary bead 100 has two first recesses 1010 respectively located on two opposite sides of the first casing 101, and a second casing 102 of the primary bead 100 has two second recesses 1020 respectively located on two opposite sides of the second casing 102. The second casing 102 is assembled with the first casing 101. The first recess 1010 and the second recess 1020 at one side of the primary bead 100 jointly define the accommodation groove 107. The two connecting members 205 are respectively disposed on the two accommodation grooves 107. Specifically, the first casing 101 and the second casing 102 jointly form the accommodation grooves 107, and the connecting member 205 is clamped by the first casing 101 and the second casing 102 to be accommodated in the accommodation groove 107. The two slots 108 are respectively connected to the two accommodation grooves 107. Each of the two connecting members 205 includes a fastening structure 2050. The two fastening structures 2050 are respectively snap-fitted to the two slots 108.

The cover 206 is movably disposed on the connecting member 205 via the stringing member 302'. Specifically, as shown in FIG. 7, when the bead string 300' is needed to move along a direction A for the user to wear the wearable electronic device 10', the cover 206 is able to be moved with the stringing member 302', such that it is favorable for the user wearing the wearable electronic device 10' to be more comfortable.

Moreover, a first radius R1 of the cover 206 is larger than a second radius R2 of the accommodation groove 107. Therefore, the cover 206 covers the connecting member 205 when attached to the primary bead 100, such that the primary bead 100 has a more beautiful appearance. The fixing ring 207 is disposed on the connecting member 205, and the stringing member 302' is securely tied to the fixing ring 207. In this embodiment, the connecting member 205 is integral with the fixing ring 207, but the disclosure is not limited thereto. In some other embodiments, the connecting member 205 and the fixing ring 207 are two separated components assembled together.

When the user wants to change the number of the subsidiary bead 301 or replace the subsidiary bead 301, the cover 206 is separated from the primary bead 100, thereby exposing the fixing ring 207 to outside. Thus, the user is able to untie the stringing member 302' fastened with the fixing ring 207 and remove the cover 206 from the stringing member 302' for changing the number of the subsidiary beads 301 or replacing a subsidiary bead 301 with another subsidiary bead having a different appearance. After the aforementioned change is accomplished, the cover 206 is strung on the stringing member 302' again, and two ends of the stringing member 302' are respectively tied to the two fixing rings 207 again. The cover 206 is moved to be attached to the primary bead 100 to consist the spacer bead 200'.

Figure 8:
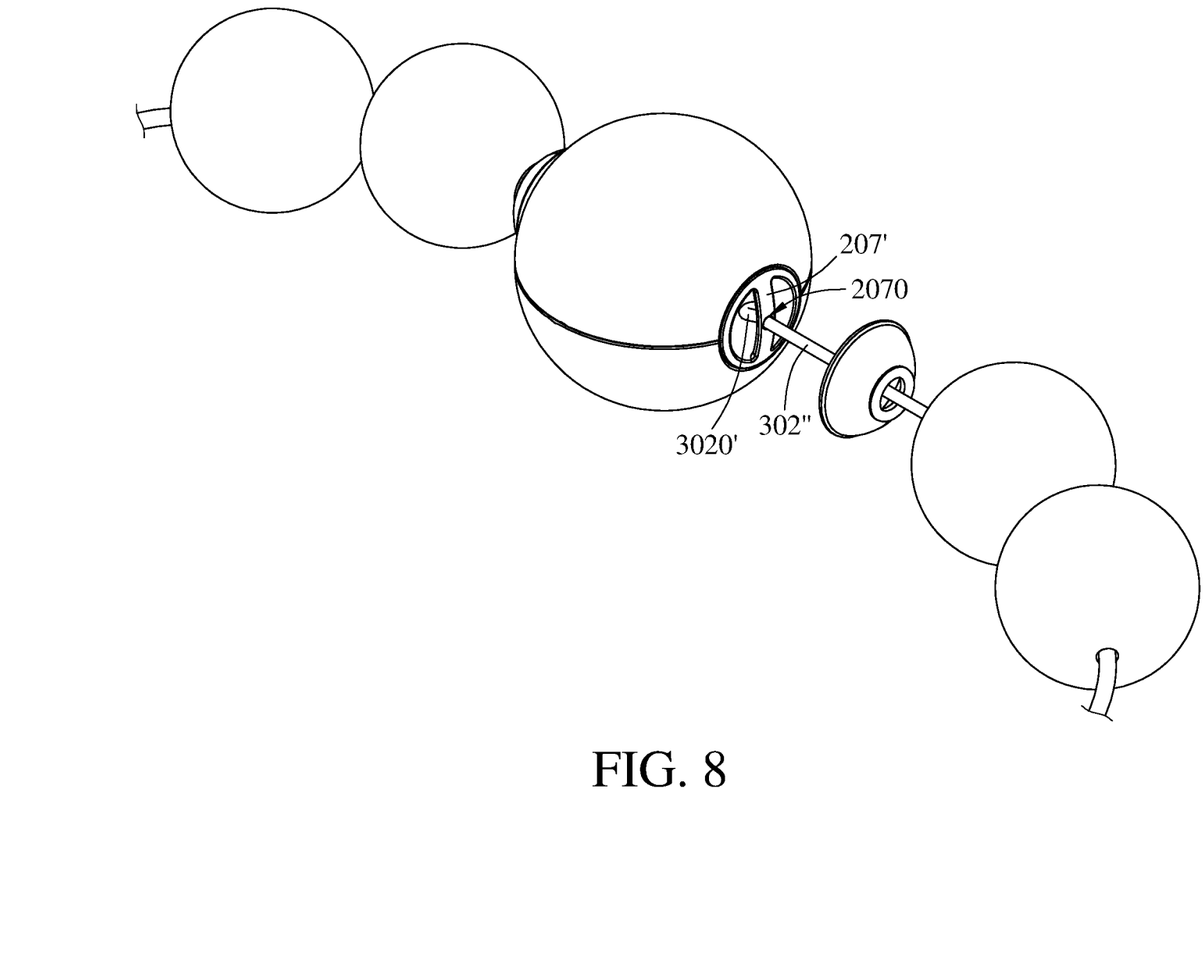
FIG. 8 is a perspective view of a wearable electronic device with a cover separated from a connecting member, according to a third embodiment.

In the second embodiment, the stringing member 302' is tied to the fixing ring 207, but the present disclosure is not limited thereto. FIG. 8 is a perspective view of a wearable electronic device with a cover separated from a connecting member, according to a third embodiment. In this embodiment, a fixing ring 207' has an opening 2070. A stringing member 302" passes through the opening 2070, and an end of the stringing member 302" is tied to form a knot 3020'. The knot 3020' is leaned against the fixing ring 207'.

Figure 9:
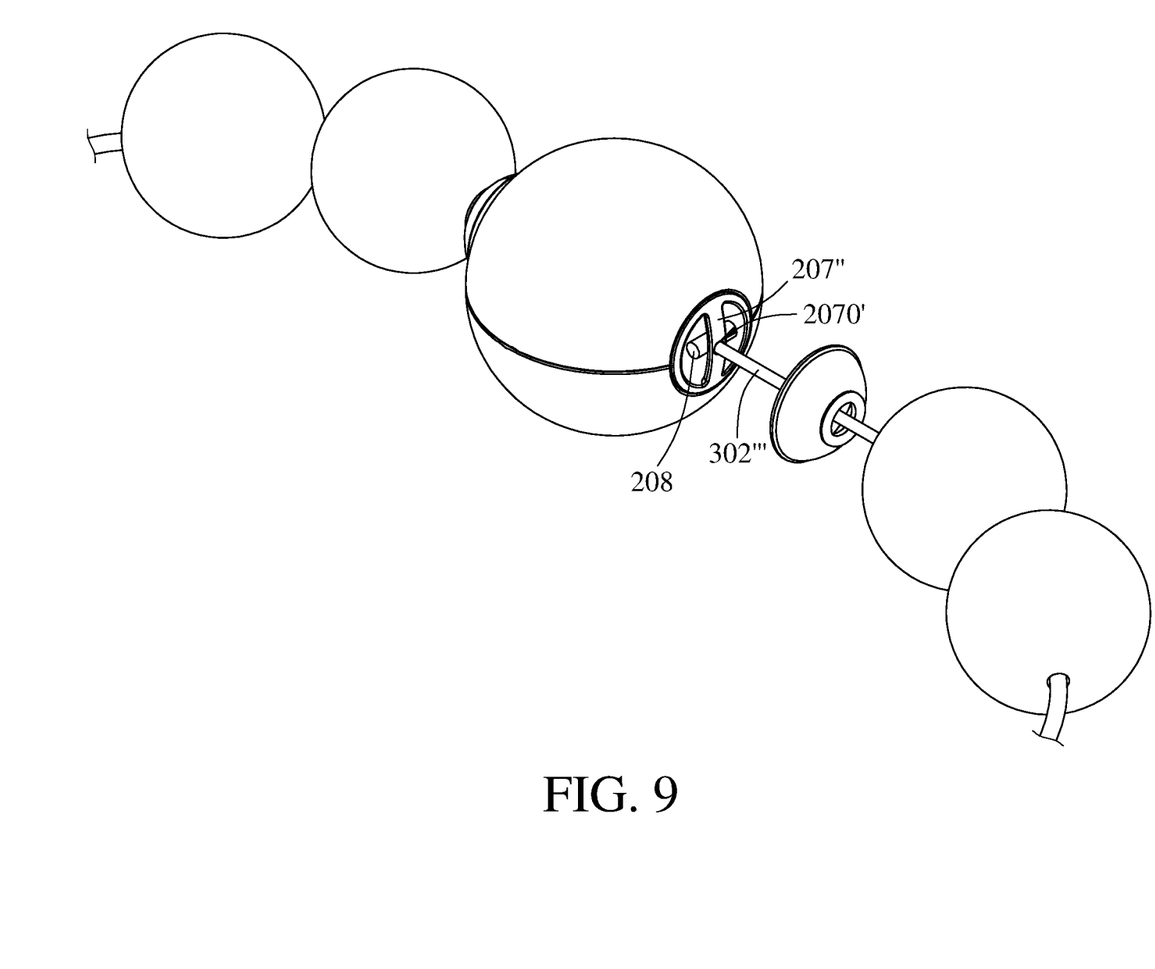
FIG. 9 is a perspective view of a wearable electronic device with a cover separated from a connecting member, according to a fourth embodiment.

In the third embodiment, the stringing member 302" is fastened with the fixing ring 207' by directly leaning the knot 3020' against the fixing ring 207', but the disclosure is not limited thereto. FIG. 9 is a perspective view of a wearable electronic device with a cover separated from a connecting member, according to a fourth embodiment. In this embodiment, an end of a stringing member 302'" is tied to a blocking member 208. The width of the blocking member 208 is larger than the width of an opening 2070' of a fixing ring 207", such that the blocking member 208 is leaned against the fixing ring 207", thereby making the stringing member 302'" fastened with the fixing ring 207".

Figure 10:
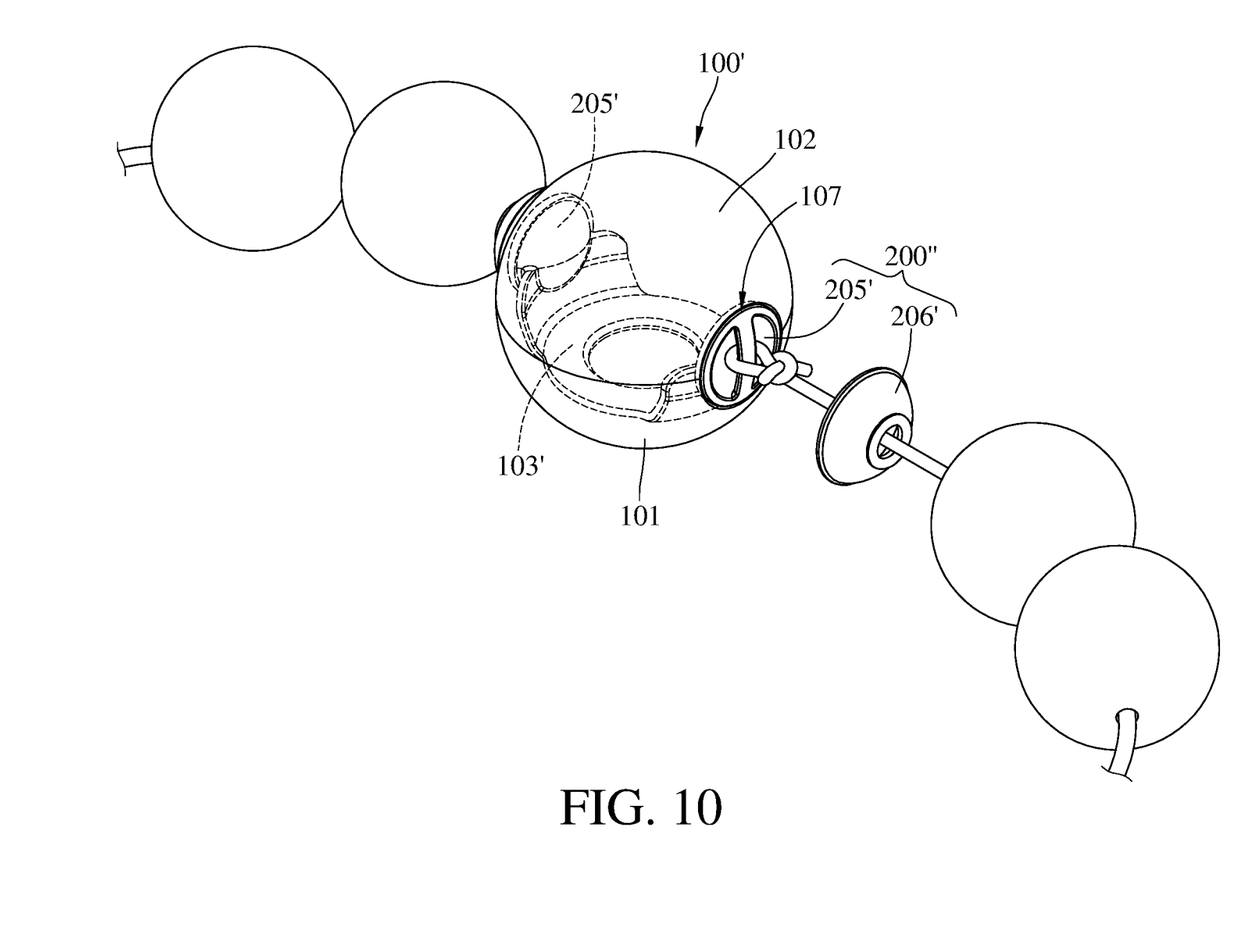
FIG. 10 is a perspective view of a wearable electronic device according to a fifth embodiment.
Figure 11:
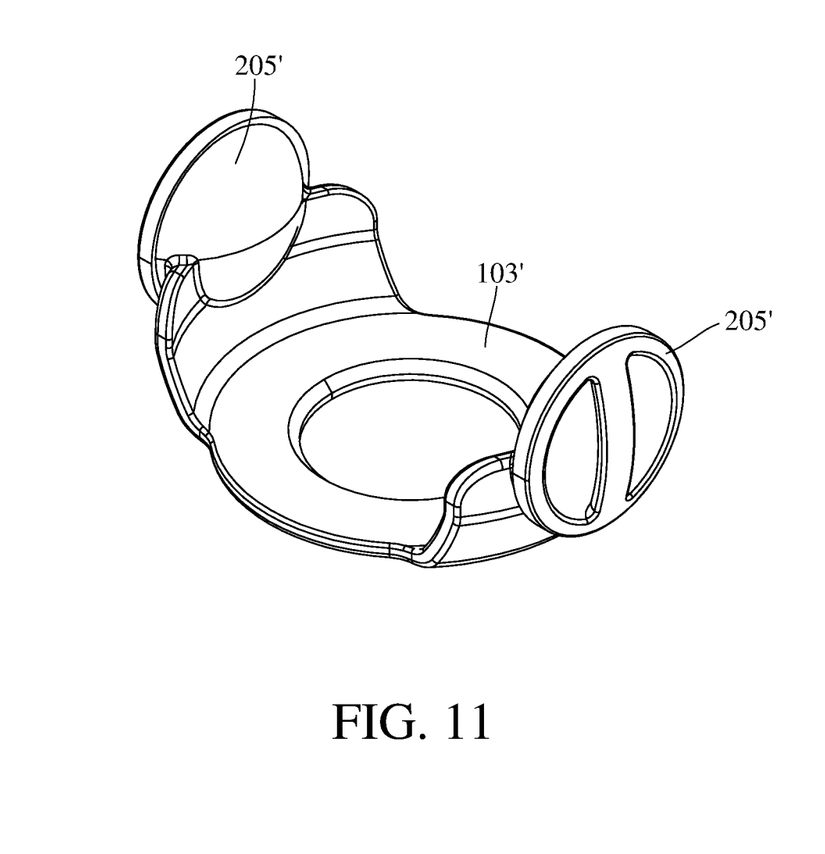
FIG. 11 is a perspective view of a base and the connecting member of the wearable electronic device in FIG. 10.

The spacer bead 200 includes the thread structure 203 screwed into the screw hole 106 of the base 103 in the first embodiment, and the fastening structure 2050 of the connecting member 205 is snap-fitted to the slot 108 of the primary bead 100 in the second embodiment, but the disclosure is not limited thereto. Please refer to FIG. 10 and FIG. 11. FIG. 10 is a perspective view of a wearable electronic device according to a fifth embodiment. FIG. 11 is a perspective view of a base and the connecting member of the wearable electronic device in FIG. 10. In this embodiment, a base 103' of a primary bead 100' includes a recessed structure; more specifically, the recessed structure of the base 103' is U-shaped. Two connecting members 205' of two spacer beads 200" are integral with the base 103'. The two connecting member 205' of the two spacer beads 200" are respectively accommodated in two accommodation grooves 107 of the primary bead 100', thereby disposing the base 103' on a first casing 101 and a second casing 102 of the primary bead 100'. Two covers 206' of the two spacer beads 200" movably cover the two connecting members 205', respectively. Therefore, it is favorable for a simpler assembly among the connecting member 205', the first casing 101 and the second casing 102. The integration of the connecting members 205' and the base 103' is favorable for enhancing the assembling strength among the connecting member 205', the first casing 101 and the second casing 102. The recessed structure of the base 103' is favorable for accommodating more electronic components in the primary bead 100', thereby achieving better space utilization in the primary bead 100'.

Figure 12:
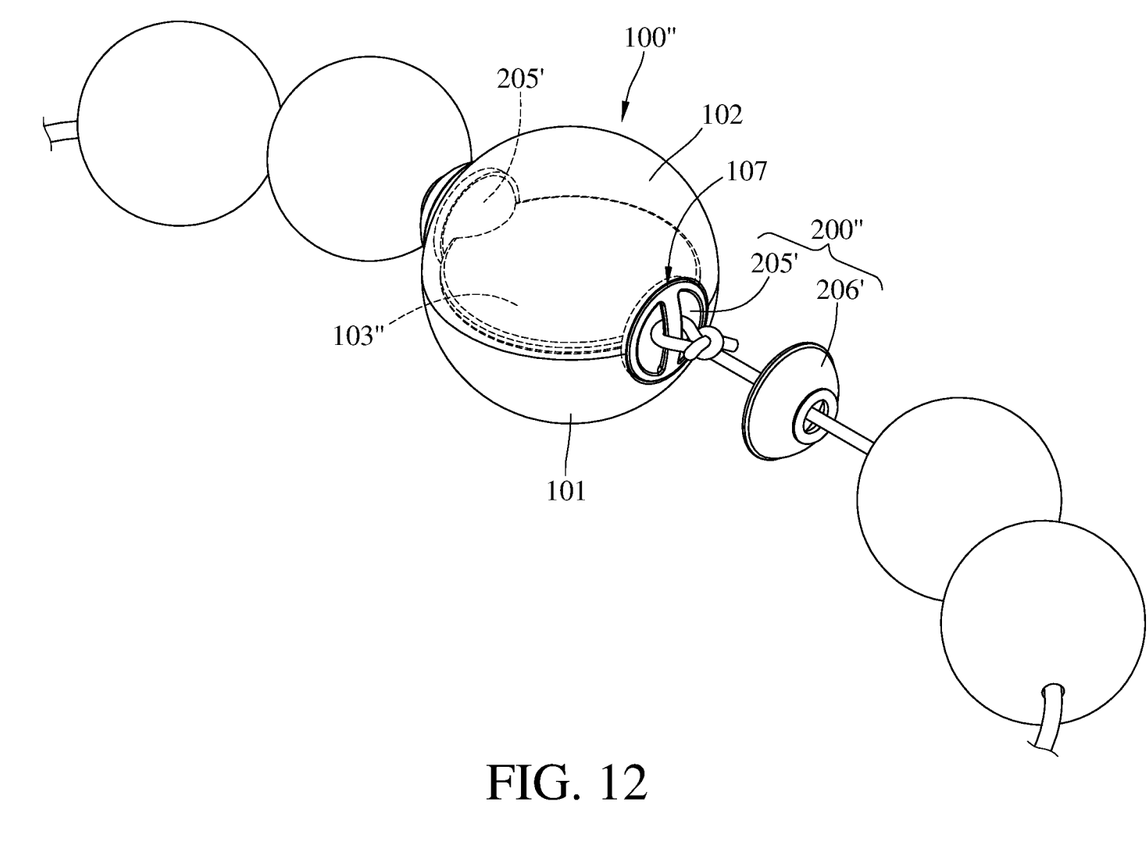
FIG. 12 is a perspective view of a wearable electronic device according to a sixth embodiment.

FIG. 12 is a perspective view of a wearable electronic device according to a sixth embodiment. In this embodiment, a base 103" of a primary bead 100" includes a platform structure; more specifically, the platform structure of the base 103" is plate-shaped. Two connecting members 205' of two spacer beads 200" are integral with the base 103". The two connecting member 205' of the two spacer beads 200" are respectively accommodated in two accommodation grooves 107 of the primary bead 100", thereby disposing the base 103" on a first casing 101 and a second casing 102.

According to the disclosure, the two spacer beads of the wearable electronic device are respectively disposed on two opposite sides of the primary bead, and the bead string is connected to the two spacer beads. Since the bead string is connected to the spacer beads rather than penetrating the primary bead, a sufficient amount of space in the primary bead is provided for accommodating necessary components. Therefore, a compact primary bead is able to accommodate more electronic components, such that it is favorable for the wearable electronic device meeting the requirement of compactness. Furthermore, the spacer beads are detachably disposed on the primary bead, such that the user is able to change the number of the subsidiary bead or replace the subsidiary bead in a convenient way; specifically, the user quickly removes the subsidiary bead by untying the knot at the end of the stringing member.

Moreover, the circular 3D antenna is fitted to the spherical primary bead, such that the 3D antenna is closely attached to the primary bead to obtain a larger amount of space for accommodating other electronic components. Therefore, it is favorable for properly utilizing the space in the primary bead, and thus a compact wearable electronic device with multiple functions is provided.

In addition, the number of the magnets disposed on the charging coil is reduced from multiple magnets to just one, and the charging coil surrounds the single magnet. The magnet is configured to fix the relative position between the primary bead and the charger. The single magnet is favorable for providing a larger amount of space in the primary bead for accommodating other components, thereby achieving better space utilization. Therefore, it is favorable for the primary bead meeting the requirements of better space utilization and compactness.

What is claimed is:

1. A wearable electronic device, comprising:
   a primary bead;
   two spacer beads each defining a first side and a second side opposite to each other, the first sides of the two spacer beads respectively disposed on two sides of the primary bead opposite to each other; and
   a bead string, two ends of the bead string respectively connected to the first sides of the two spacer beads or extended out from the second sides of the two spacer beads;
   wherein each of the two spacer beads has a thread structures located on the first side, the primary bead comprises two screw holes, the two screw holes are located on the two sides of the primary bead opposite to each other, and the thread structures of the two spacer beads are respectively screwed into the two screw holes;
   wherein the primary bead comprises a first casing, a second casing, and a base; the first casing has two first recesses located on two sides of the first casing opposite to each other, the second casing has two second recesses located on two sides of the second casing opposite to each other, the first casing is assembled with the second casing, one of the two first recesses and one of the two second recesses jointly define an accommodation groove at one of the two sides of the primary bead, another one of the two first recesses and another one of the two second recesses jointly define another accommodation groove at another one of the two sides of the primary bead, the base is surrounded by the first casing and the second casing, the base comprises the two screw holes respectively accommodated in the two accommodation grooves.

2. The wearable electronic device according to claim 1, wherein the bead string comprises a plurality of subsidiary beads and a stringing member, the plurality of subsidiary beads are strung on the stringing member, two of the subsidiary beads are respectively adjacent to the two spacer beads, the stringing member comprises two knots respectively located on two ends of the stringing member opposite to each other, each of the two spacer beads has a through hole, a first section of the through hole and a second section of the through hole are connected to each other, the first section is closer to the subsidiary bead than the second section, a width of the second section is larger than a width of the first section, and the knot is leaned against a bearing surface of the through hole between the first section and the second section.

3. The wearable electronic device according to claim 1, wherein the base comprises a platform structure.

4. The wearable electronic device according to claim 1, wherein the base comprises a recessed structure.

5. The wearable electronic device according to claim 1, wherein each of the two spacer beads comprises a connecting member and a cover, the connecting member is detachably disposed on the primary bead, and the cover is movably disposed on the connecting member.

6. The wearable electronic device according to claim 5, wherein the connecting members of the two spacer beads are respectively accommodated in the two accommodation grooves.

7. The wearable electronic device according to claim 6, wherein the base comprises a recessed structure, the base is integral with the connecting members of the two spacer beads, and the base is disposed on the two accommodation grooves via the connecting members.

8. The wearable electronic device according to claim 6, wherein the base comprises a platform structure, the base is integral with the connecting members of the two spacer beads, and the base is disposed on the two accommodation grooves via the connecting members.

9. The wearable electronic device according to claim 6, wherein a first radius of the cover is larger than a second radius of the accommodation groove.

10. The wearable electronic device according to claim 5, wherein each of the two spacer beads further comprises a fixing ring disposed on the connecting member.

11. The wearable electronic device according to claim 10, wherein the bead string passes through an opening of the fixing ring.

12. The wearable electronic device according to claim 1, wherein the primary bead comprises an electronic assembly, the electronic assembly comprises a circuit board and a three dimensional (3D) antenna, the circuit board is disposed on the base, the 3D antenna is electrically connected to the circuit board, and the 3D antenna is circular.

13. The wearable electronic device according to claim 12, wherein the circuit board is disposed on a side of the base, and the 3D antenna is disposed on a side of the circuit board away from the base.

14. The wearable electronic device according to claim 13, wherein the electronic assembly further comprises a power supply, the power supply comprises a battery, a wireless charging member, and a magnet, the battery is disposed on the base and electrically connected to the circuit board, the wireless charging member is electrically connected to the battery, and the magnet is disposed nearby the wireless charging member.

15. The wearable electronic device according to claim 14, wherein the battery is disposed on a side of the base away from the circuit board.

16. The wearable electronic device according to claim 15, wherein the wireless charging member is disposed on a side of the battery away from the base.

17. The wearable electronic device according to claim 16, wherein the magnet is disposed on a side of the wireless charging member away from the battery.

18. The wearable electronic device according to claim 17, wherein the wireless charging member comprises a microvibrator and a charging coil, the microvibrator is disposed on the side of the battery away from the base, the charging coil covers the microvibrator and electrically connected to the battery, the magnet is accommodated in an accommodation space of the charging coil.

* * * * *